United States Patent
Kaneko

(10) Patent No.: US 11,932,967 B2
(45) Date of Patent: Mar. 19, 2024

(54) SiC SINGLE CRYSTAL MANUFACTURING METHOD, SiC SINGLE CRYSTAL MANUFACTURING DEVICE, AND SiC SINGLE CRYSTAL WAFER

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Sanda (JP)

(73) Assignees: KWANSEI GAKUIN EDUCATIONAL FOUNDATION, Hyogo (JP); TOYOTA TSUSHO CORPORATION, Nagoya (JP)

(*) Notice: Subject to any disclaimer, the term of this patent is extended or adjusted under 35 U.S.C. 154(b) by 14 days.

(21) Appl. No.: 17/764,116

(22) PCT Filed: Sep. 24, 2020

(86) PCT No.: PCT/JP2020/036003
§ 371 (c)(1),
(2) Date: Mar. 25, 2022

(87) PCT Pub. No.: WO2021/060368
PCT Pub. Date: Apr. 1, 2021

(65) Prior Publication Data
US 2023/0024750 A1 Jan. 26, 2023

(30) Foreign Application Priority Data
Sep. 27, 2019 (JP) .................................. 2019-178069

(51) Int. Cl.
*C30B 33/02* (2006.01)
*C30B 23/02* (2006.01)
(Continued)

(52) U.S. Cl.
CPC ............ *C30B 33/02* (2013.01); *C30B 23/025* (2013.01); *C30B 23/063* (2013.01); *C30B 33/12* (2013.01)

(58) Field of Classification Search
CPC ....... C30B 33/02; C30B 23/02; C30B 23/003; C30B 33/12
See application file for complete search history.

(56) References Cited

U.S. PATENT DOCUMENTS

2016/0118257 A1    4/2016  Tadaaki et al.
2016/0215414 A1*   7/2016  Nakabayashi ...... H01L 29/1608
(Continued)

FOREIGN PATENT DOCUMENTS

CN    102543718 A    7/2012
CN    106968018 B    2/2019
(Continued)

OTHER PUBLICATIONS

English Translation of International Search Report from PCT/JP2020/036003 dated Dec. 1, 2020 (2 pages).
(Continued)

*Primary Examiner* — Robert M Kunemund
(74) *Attorney, Agent, or Firm* — Calfee, Halter & Griswold LLP

(57) ABSTRACT

An object of the present invention is to provide a novel SiC single crystal with reduced internal stress while suppressing SiC sublimation. In order to solve the above problems, the present invention provides a method for producing SiC single crystals, including a stress reduction step of heating a SiC single crystal at 1800° C. or higher in an atmosphere containing Si and C elements to reduce internal stress in the SiC single crystal. With this configuration, the present invention can provide a novel SiC single crystal with reduced internal stress while suppressing SiC sublimation.

14 Claims, 9 Drawing Sheets

(51) Int. Cl.
   *C30B 23/06*     (2006.01)
   *C30B 33/12*     (2006.01)

(56) References Cited

U.S. PATENT DOCUMENTS

| | | | |
|---|---|---|---|
| 2016/0231256 A1* | 8/2016 | Kojima | G01N 21/9505 |
| 2017/0114475 A1 | 4/2017 | Yabuki et al. | |
| 2017/0137962 A1* | 5/2017 | Ma | C30B 23/025 |
| 2019/0136409 A1 | 5/2019 | Tadaaki et al. | |
| 2019/0194818 A1 | 6/2019 | Igi | |
| 2020/0095703 A1 | 3/2020 | Satoshi et al. | |
| 2021/0091187 A1* | 3/2021 | Araoka | H01L 29/7813 |

FOREIGN PATENT DOCUMENTS

| | | |
|---|---|---|
| EP | 3128047 A1 | 2/2017 |
| JP | H11-87257 A | 3/1999 |
| JP | 2008-103650 A | 5/2008 |
| JP | 2016-050141 A | 4/2016 |
| JP | 2018-158858 A | 10/2018 |
| WO | 2014/199615 A1 | 12/2014 |
| WO | 2017/188381 A1 | 11/2017 |
| WO | 2018/174105 A1 | 9/2018 |

OTHER PUBLICATIONS

English Translation of Office Action from Chinese Application No. 202080065931.3 dated Apr. 8, 2023 (12 pages).
EPO Communication and European Search Report issued in EP application No. 20867300.4 dated Jun. 30, 2023 (7 pages).

* cited by examiner (a)

(b)

(c)

(d)

(a)

(b)

(a)

(b)

SiC SINGLE CRYSTAL MANUFACTURING METHOD, SiC SINGLE CRYSTAL MANUFACTURING DEVICE, AND SiC SINGLE CRYSTAL WAFER

CROSS-REFERENCE TO RELATED APPLICATIONS

This application is a 371 of PCT Application No. PCT/JP2020/036003, filed on Sep. 24, 2020, which claims priority to Japanese Application No. 2019-178069, filed on Sep. 27, 2019, the contents of which are hereby incorporated by reference as if recited in their entirety.

TECHNICAL FIELD

The present invention relates to a method for producing SiC single crystals, an apparatus for producing SiC single crystals, and a SiC single crystal wafer.

BACKGROUND ART

Silicon carbide (SiC) has superior physical properties to silicon (Si), in terms of dielectric breakdown strength, thermal conductivity, radiation resistance and the like, and is being researched and developed as a material for electronic devices.

In the related art, "warpage" of SiC single crystal substrates has been regarded as a problem. Warpage, for example, is a factor that causes the exposure distance to deviate from the focal length of the optical system in the exposure step, and is also a factor that prevents suitable wafer chucking.

In order to address this problem, a technology has been proposed to reduce "warpage" caused by processing strain by annealing heat treatment of SiC single crystal substrates.

For example, Patent Literature 1 describes a technology for annealing heat treatment at a temperature of 1300° C. to 2000° C. in a silicon carbide non-corrosive gas atmosphere after double-sided lapping and polishing. According to the description, this reduces the "warpage" caused by processing strain.

CITATION LIST

Patent Literature

Patent Literature 1: JP 2008-103650 A

Non Patent Literature

Non Patent Literature 1: Hiroyuki Matsunami, Tsunenobu Kimoto, Takashi Nakamura, Noboru Otani (eds.), "Semiconductor SiC Technology and Applications", 2nd Edition, Nikkan Kogyo Shimbun, Ltd., Sep. 30, 2011, pp. 36-37

SUMMARY OF INVENTION

Technical Problem

The cause of "warpage" of SiC single crystal substrates is not only the warpage caused by processing strain (so-called Twyman effect) as described in Patent Literature 1, but also the warpage caused by internal stress introduced during ingot growth. The warpage caused by internal stress becomes apparent when the diameter of the SiC single crystal substrate increases and the diameter of the SiC single crystal substrate becomes larger.

In order to reduce such internal stress, it is necessary to heat the substrate in a temperature range close to that of ingot growth, but heating in this temperature range causes excessive etching and thinning of the SiC single crystal substrate due to SiC sublimation.

In the invention described in Patent Literature 1, for example, if the SiC single crystal substrate is annealed and heat-treated in the temperature range above 2000° C., surface carbonization becomes more pronounced due to the pyrolysis reaction caused by sublimation. As a result, it has been difficult to reduce the internal stress of SiC single crystal substrates, which is considered to be a problem as the diameter becomes larger.

Non Patent Literature 1 describes that internal stress has been suppressed by controlling the temperature distribution of crystals, and the problem of ingot cracking at 4 inches has been solved. However, if the diameter becomes larger, such as 6 inches and 8 inches, the problem of internal stress is expected to become even larger.

In view of the aforementioned problems, an object of the present invention is to provide a novel SiC single crystal with reduced internal stress while suppressing SiC sublimation.

Solution to Problem

In order to solve the above problems, the present invention provides a method for producing SiC single crystals, including a stress reduction step of heating a SiC single crystal at 1800° C. or higher in an atmosphere containing Si and C elements to reduce internal stress in the SiC single crystal. With this configuration, the present invention can provide a novel SiC single crystal with reduced internal stress while suppressing SiC sublimation.

In a preferred mode of the present invention, in the stress reduction step, the SiC single crystal is heated without changing the thickness and diameter of the SiC single crystal. With this configuration, the present invention can provide a novel SiC single crystal with reduced internal stress while suppressing SiC sublimation.

In a preferred mode of the present invention, in the stress reduction step, the SiC single crystal is heated in a semi-closed space. With this configuration, in the present invention, the SiC single crystal can be heated under the desired vapor pressure environment.

In a preferred mode of the present invention, in the stress reduction step, the SiC single crystal is heated in an atmosphere containing an inert gas. With this configuration, in the present invention, the SiC single crystal can be heated while suppressing SiC sublimation.

In a preferred mode of the present invention, in the stress reduction step, the SiC single crystal is heated to uniformize the temperature of the SiC single crystal. With this configuration, in the present invention, the generation of internal stress caused by the temperature distribution of the SiC single crystal can be suppressed.

A preferred mode of the present invention further includes a heat treatment step of heating the SiC single crystal and the SiC material at 1400° C. or higher in an atmosphere containing Si and C elements, and the heat treatment step includes an etching step and/or a growth step. With this configuration, in the present invention, the SiC single crystal can be etched and grown at a lower temperature than the temperature in the stress reduction step.

In a preferred mode of the present invention, in the heat treatment step, the SiC single crystal and the SiC material are heated so that the SiC single crystal is on the high temperature side and the SiC material is on the low temperature side, and the SiC single crystal is etched. With this configuration, in the present invention, the temperature difference between the SiC single crystal and the SiC material can be controlled, and the SiC single crystal with reduced internal stress can be etched.

In a preferred mode of the present invention, in the heat treatment step, the SiC single crystal and the SiC material are heated so that the SiC single crystal is on the low temperature side and the SiC material is on the high temperature side, and the SiC single crystal is crystal-grown. With this configuration, in the present invention, the temperature difference between the SiC single crystal and the SiC material can be controlled, and the SiC single crystal with reduced internal stress can be crystal-grown.

In a preferred mode of the present invention, the heat treatment step includes a step of heating the SiC single crystal and the SiC material in a semi-closed space having an atomic number ratio Si/C of 1 or less. With this configuration, in the present invention, etching and crystal growth can be performed in the SiC single crystal with reduced internal stress in a SiC—C equilibrium vapor pressure environment.

In a preferred mode of the present invention, the heat treatment step includes a step of heating the SiC single crystal and the SiC material in a semi-closed space having an atomic number ratio Si/C of more than 1. With this configuration, in the present invention, etching and crystal growth can be performed in a SiC single crystal with reduced internal stress in a SiC—Si equilibrium vapor pressure environment.

In a preferred mode of the present invention, the heat treatment step includes a strained layer removal step of etching a strained layer on the SiC single crystal. With this configuration, the present invention achieves both the reduction of internal stress in the SiC single crystal and the removal of the strained layer caused by mechanical processing and other factors.

In a preferred mode of the present invention, the heat treatment step includes a bunching decomposition step of decomposing macro-step bunching on the SiC single crystal to planarize the surface of the SiC single crystal. With this configuration, the present invention realizes a planarized surface on the SiC single crystal, such that it is terminated by a step that presents the height of a full unit in the SiC single crystals.

In a preferred mode of the present invention, the heat treatment step includes an epitaxial growth step of forming a growth layer having a BPD density of <100/cm$^2$. With this configuration, in the present invention, the reduction of internal stress in the SiC single crystal and suitable BPD conversion can be both achieved.

A preferred mode of the present invention is a method for producing a SiC single crystal including the stress reduction step and the heat treatment step in this order. With this configuration, the present invention allows crystal growth of a high-quality growth layer on the SiC single crystal with reduced internal stress by the stress reduction step.

In order to solve the aforementioned problems, the present invention provides an apparatus for producing SiC single crystals, including a main container including a SiC material and capable of housing a SiC single crystal, and a heating furnace capable of heating the main container at 1800° C. or higher. With this configuration, the present invention can provide a novel SiC single crystal with reduced internal stress while suppressing SiC sublimation.

In a preferred mode of the present invention, the heating furnace is capable of heating the SiC single crystal while uniformizing its temperature. With this configuration, in the present invention, the generation of internal stress caused by the temperature distribution of the SiC single crystal can be suppressed.

In a preferred mode of the present invention, the heating furnace has a refratory container capable of housing the main container. With this configuration, in the present invention, the SiC single crystal can be heated under the desired vapor pressure environment.

In order to solve the aforementioned problems, the present invention provides a SiC single crystal wafer with a warpage amount of <30 μm and a diameter of 6 inches or more. With this configuration, the present invention can provide a novel SiC single crystal with reduced internal stress while suppressing SiC sublimation, contributing to the production of high quality SiC devices.

In a preferred mode of the present invention, the SiC single crystal wafer has a growth layer having a BPD density of <100 cm$^2$. With this configuration, the present invention can provide a novel SiC single crystal that is expected to reduce internal stress and suppress defect formation, contributing to the production of high quality SiC devices.

In a preferred mode of the present invention, the SiC single crystal wafer has a base substrate having a BPD density of 5000 cm$^2$ or more.

Advantageous Effects of Invention

The present invention can provide a novel SiC single crystal with reduced internal stress while suppressing SiC sublimation.

Other problems, features, and advantages will become apparent by reading the embodiments for implementing the present invention described below, when taken up together with the drawings and claims.

DESCRIPTION OF EMBODIMENTS

A preferred embodiment of the present invention will be described below with reference to drawings.

The technical scope of the present invention is not limited to the embodiments illustrated in the accompanying drawings, and may be modified as necessary within the scope of the claims.

An embodiment of the present invention includes at least a stress reduction step S0.

Figure 1:
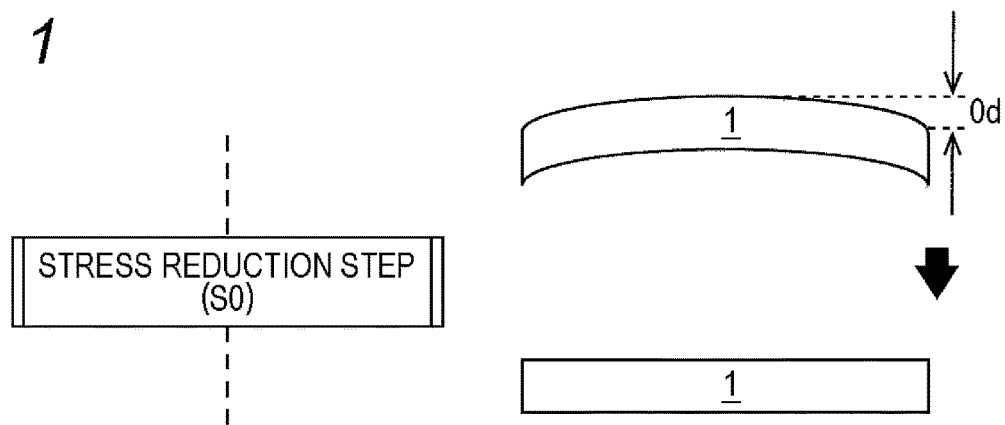
FIG. 1 schematically illustrates the stress reduction step according to an embodiment of the present invention.

As illustrated in FIG. 1, it can be understood that the stress reduction step S0 includes reducing the warpage amount 0d of a SiC single crystal 1 by causing slippage in the SiC single crystal 1. It can also be understood that the total thickness variation (TTV) of the SiC single crystal 1 is also reduced.

It can also be understood that the stress reduction step S0 uniformizes the interlattice distance of the SiC single crystal 1, reduces the internal stress of the SiC single crystal 1, reduces the thermal stress of the SiC single crystal 1, or reduces the residual stress of the SiC single crystal 1.

The stress reduction step S0 also includes heating at least the SiC single crystal 1 without changing the thickness and diameter, the volume, and the dimensions and size of the SiC single crystal 1 so as to inhibit etching or crystal growth on the surface of the SiC single crystal 1.

Figure 2:
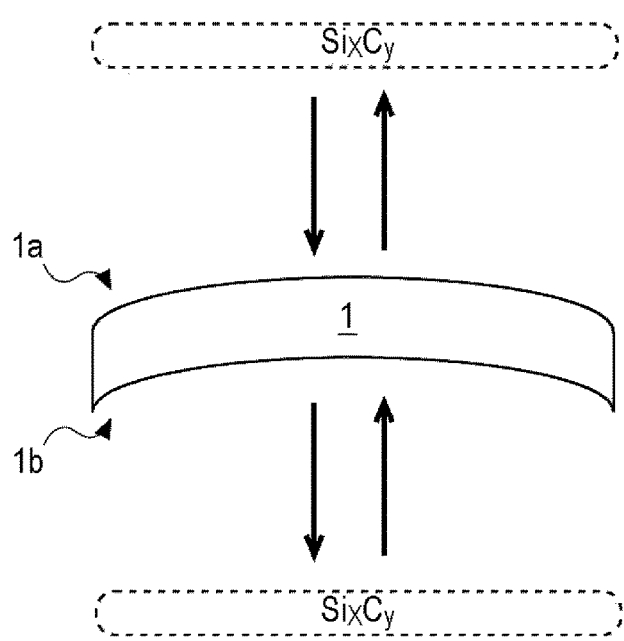
FIG. 2 schematically illustrates the stress reduction step according to an embodiment of the present invention.

As illustrated in FIG. 2, the stress reduction step S0 includes heating at least the SiC single crystal 1 in an atmosphere containing Si and C elements, such as a $Si_xC_y$ gas atmosphere.

At this time, it can be understood that pyrolysis, crystal growth, and others occur sequentially in the SiC single crystal 1, and Si and C elements circulate between the surfaces 1a and 1b of the SiC single crystal 1 and the atmosphere containing Si and C elements.

The stress reduction step S0 includes heating at least the SiC single crystal 1 in a semi-closed space. The "semi-closed space" in the present description refers to a space in which at least a portion of the vapor generated can be confined, although vacuation is still possible.

In the stress reduction step S0, the SiC single crystal 1 is heated in an atmosphere containing an inert gas. As used herein, the term "inert gas" is any known inert gas in the SiC process, such as Ar gas.

In the stress reduction step S0, the SiC single crystal 1 is heated in the temperature range where the SiC material sublimates. The temperature range is, for example, 1800° C. or higher.

In addition, in the stress reduction step S0, the SiC single crystal 1 is heated to uniformize the temperature in the SiC single crystal 1. As used herein, the term "uniformize the temperature in the SiC single crystal 1" refers to heating the SiC single crystal 1 so that the temperature difference between the highest and lowest temperatures in the SiC single crystal 1 is within the allowable temperature difference, thus reducing the temperature gradient in the SiC single crystal 1.

The allowable temperature difference is preferably 50° C. or less, more preferably 20° C. or less, even more preferably 10° C. or less, yet even more preferably 5° C. or less, yet even more preferably 2° C. or less, and yet even more preferably 1° C. or less.

Non Patent Literature 1 describes that a moderate temperature gradient is necessary to induce crystal growth, but the presence of the temperature gradient inside the crystal leads to residual thermal stress in the crystal itself.

Non Patent Literature 1 describes that, depending on the temperature distribution, residual thermal stress may be excessively high in some areas, especially when growing large-diameter single crystals, resulting in frequent crystal cracking problems.

Non Patent Literature 1 describes that reducing internal stress by optimizing the temperature gradient in the crystal in-plane direction during growth is necessary to reduce the stress components that have a significant impact on crystal cracking.

Non Patent Literature 1 describes that by reducing the local stress that induces crystal cracking, it is possible to achieve single crystal growth with no crystal cracking even in a 4-inch diameter crystal.

Thus, the effect of internal stress caused by temperature distribution in the SiC single crystal 1 seen as a problem as the diameter of wafers and ingots become larger.

It can be understood that the effect of the internal stress in the SiC single crystal 1 is problematic when the diameter of the SiC single crystal 1 is, for example, 4 inches, and is even more problematic when the diameter of the SiC single crystal 1 is, for example, 6, 8, or 12 inches.

In addition, in the stress reduction step S0, the SiC single crystal 1 is heated at a degree of vacuum such that sublimation of the SiC material and the raw material transport described later are suppressed.

The degree of vacuum is preferably 1.0 Pa or less, more preferably $10^{-1}$ Pa or less, even more preferably $10^{-2}$ Pa or less, yet even more preferably $10^{-3}$ Pa or less, yet even more preferably $10^{-4}$ Pa or less, and yet even more preferably $10^{-5}$ Pa or less. In addition, the degree of vacuum is preferably $10^{-1}$ Pa or more, more preferably $10^{-2}$ Pa or more, even more preferably $10^{-3}$ Pa or more, yet even more preferably $10^{-4}$ Pa or more, yet even more preferably $10^{-5}$ Pa or more, and yet even more preferably $10^{-6}$ Pa or more.

In the stress reduction step S0, the SiC material 2 may be heated together with the SiC single crystal 1 to form an atmosphere containing the aforementioned Si and C elements.

In the stress reduction step S0, the SiC single crystal 1 and the SiC material 2 are heated in close proximity. As used herein, the term "proximity" refers, for example, to the separation distance d1 (not illustrated) between the SiC single crystal 1 and the SiC material 2.

The separation distance d1 is preferably 2.0 mm or less, more preferably 1.0 mm or less, even more preferably 0.5 mm or less, yet even more preferably 0.1 mm or less, and yet even more preferably 10 μm or less. In addition, the separation distance d1 is preferably 1.0 μm or more, more preferably 10 μm or more, even more preferably 0.1 mm or more, yet even more preferably 0.5 mm or more, and yet even more preferably 1.0 mm or more.

In the stress reduction step S0, the SiC single crystal 1 and the SiC material 2 are heated to reduce the chemical potential difference or vapor pressure difference between the surfaces of the SiC single crystal 1 and the SiC material 2, respectively. At this time, each of the chemical potential difference and vapor pressure difference corresponds to the case where no raw material transport described later occurs.

In the stress reduction step S0, the SiC single crystal 1 and the SiC material 2 are heated to reduce the temperature gradient between the SiC single crystal 1 and the SiC material 2. As used herein, the term "reducing the temperature gradient between the SiC single crystal 1 and the SiC material 2" refers, for example, to heating the SiC single crystal 1 and the SiC material 2 so that the temperature difference between them is 10° C. or less.

It can be understood that in the stress reduction step S0, the SiC single crystal 1 and the SiC material 2 are heated so that either the SiC single crystal 1 or the SiC material 2 becomes the source or the destination of the raw material transport, and equilibrium relationship between the SiC single crystal 1 and the SiC material 2 is achieved.

It can be understood that the stress reduction step S0 reduces the internal stress of the SiC single crystal 1 to maintain the surface shape of the SiC single crystal 1, which exhibits a three-dimensional structure such as a trench structure, whereby the strain introduced during the formation of the three-dimensional structure is alleviated. Specifically, in the stress reduction step S0, the internal stress and strain of the SiC single crystal 1 are reduced so as to suppress excessive etching (thinning) at the side walls and/or bottom of the trench structure.

The SiC single crystal 1 may be a SiC ingot produced by a known crystal growth method such as sublimation, or a SiC wafer sliced into a disk shape from the SiC ingot. The polytype of the SiC single crystal 1 refers to a known polytype such as 3C, 4H, or 6H.

The cross-sectional size of the SiC single crystal 1 is a few centimeters, 2 inches, 3 inches, 4 inches, 6 inches, 8 inches, or 12 inches square. There is no limit to the size of the cross section.

The surface of the SiC single crystal 1 may be configured to have an off-angle of a few degrees (for example, from 0.4 to 8.0°) from the (0001) or (000-1) plane. The "-" in the description herein refers to the bar in the Miller index notation.

The SiC material 2 may be a SiC ingot produced by sublimation or other method, a SiC wafer sliced into a disk shape from the SiC ingot, or SiC polycrystals.

The SiC material 2 may be SiC single crystals, SiC polycrystals, a SiC material forming a semi-closed space, or a SiC material exposed in a semi-closed space.

An embodiment of the present invention further includes a heat treatment step SX.

The heat treatment step SX includes heating the SiC single crystal 1 and the SiC material 2 in an atmosphere containing Si and C elements, such a $Si_xC_y$ gas atmosphere.

In the heat treatment step SX, the SiC single crystal 1 and the SiC material 2 are heated in a temperature range lower than that in the stress reduction step S0. The temperature range is preferably 1400° C. or higher. As used herein, the term "low temperature range" refers to a temperature range where the lowest temperature in that range is low.

It can be understood that the heat treatment step SX includes an etching step S1 and/or a growth step S2, acts as the etching step S1, or acts as the growth step S2.

The etching step S1 includes heating the SiC single crystal 1 and the SiC material 2 so that the SiC single crystal 1 is on the high temperature side and the SiC material 2 is on the low temperature side, thereby etching the SiC single crystal 1.

It can be understood that the etching step S1 includes a strained layer removal step S11 of placing the SiC single crystal 1 and the SiC material 2 in a semi-closed space having an atomic number ratio Si/C of 1 or less, and heating them to etch the SiC single crystal 1, or acts as the strained layer removal step S11.

It can be understood that the etching step S1 also includes a bunching decomposition step S12 of placing the SiC single crystal 1 and the SiC material 2 in a semi-closed space having an atomic number ratio Si/C of more than 1, and heating them to etch the SiC single crystal 1, or acts as the bunching decomposition step S12.

Figure 3:
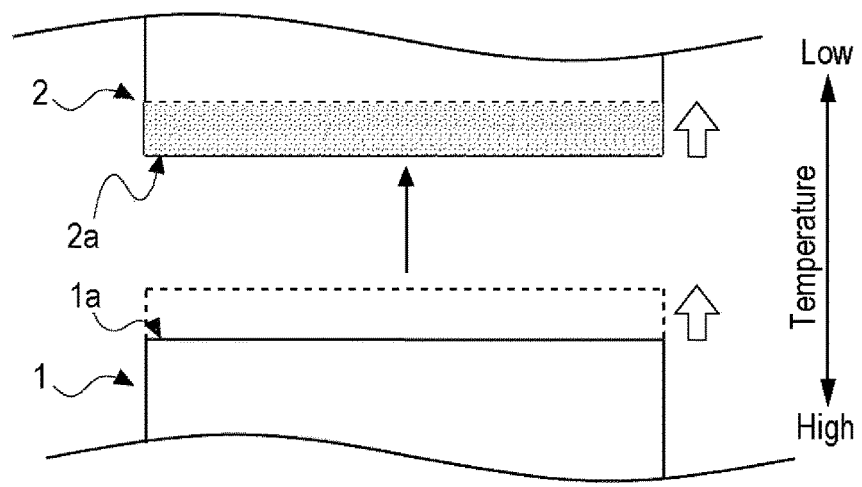
FIG. 3 schematically illustrates the etching step according to an embodiment of the present invention.

As illustrated in FIG. 3, in the etching step S1, the SiC single crystal 1 and the SiC material 2 are heated so that the surface 1a of SiC single crystal 1 and the surface 2a of the SiC material 2 are etched and grown, respectively.

As illustrated in FIG. 3, it can be understood that in the etching step S1, the SiC single crystal 1 and the SiC material 2 are heated so that the SiC single crystal 1 and the SiC material 2 become the source and destination of raw material transport, respectively.

Figure 4:
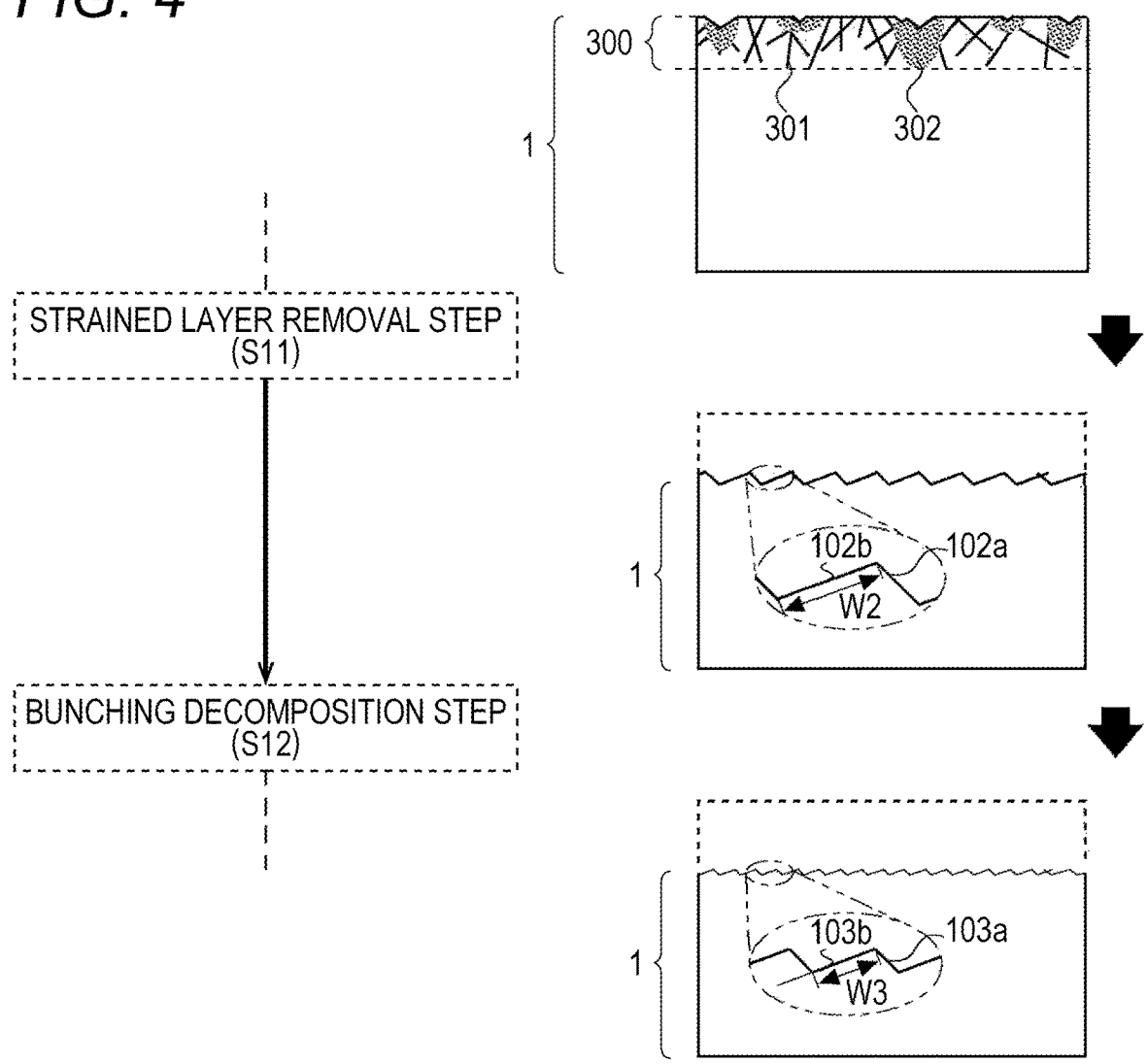
FIG. 4 schematically illustrates the etching step according to an embodiment of the present invention.

As illustrated in FIG. 4, the strained layer removal step S11 includes etching the strained layer 300 on the surface of the SiC single crystal 1. The strained layer 300 may include crystal dislocations 301 and/or damaged regions 302.

As illustrated in FIG. 4, in the strained layer removal step S11, the SiC single crystal 1 is etched so that the surface having the steps 102a and the terraces 102b presenting a lengthened terrace length W2 is exposed, or the bunched surface is exposed.

As illustrated in FIG. 4, the bunching decomposition step S12 includes etching the surface 1a of the SiC single crystal 1 having the steps 102a and the terraces 102b to decompose the MSBs of the surface 1a so as to expose the surface having steps 103a and terraces 103b presenting a reduced terrace length W3, or to form a planarized, bunching-free surface. At this time, the surface 1a is terminated with the step that presents the height of a full unit in the SiC single crystals.

Figure 5:
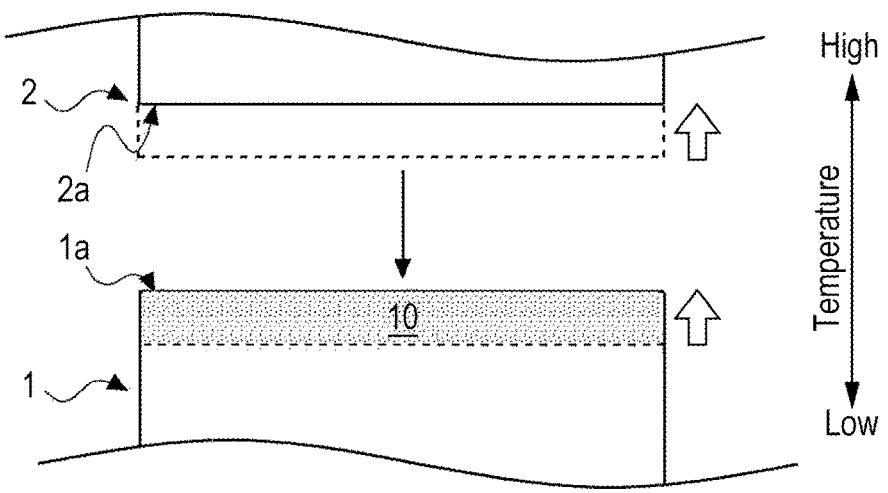
FIG. 5 schematically illustrates the growth step according to an embodiment of the present invention.

As illustrated in FIG. 5, the growth step S2 includes heating the SiC single crystal 1 and the SiC material 2 so that the SiC single crystal 1 is on the low temperature side and the SiC material 2 is on the high temperature side, and crystal-growing the SiC single crystal 1 to form a growth layer 10 on the surface of the SiC single crystal 1.

As illustrated in FIG. 5, in the growth step S2, the SiC single crystal 1 and the SiC material 2 are heated so that the surface 1a of the SiC single crystal 1 and the surface 2a of the SiC material 2 are grown and etched, respectively.

As illustrated in FIG. 5, in the growth step S2, the SiC single crystal 1 and the SiC material 2 are heated so that they become the destination and source of raw material transport, respectively.

It can also be understood that the growth step S2 includes an epitaxial growth step S21 of placing the SiC single crystal 1 and the SiC material 2 in a semi-closed space having an atomic number ratio Si/C of 1 or less, and heating them to grow the SiC single crystal 1, or acts as the epitaxial growth step S21.

It can also be understood that the growth step S2 includes a bunching decomposition step S22 of placing the SiC single crystal 1 and the SiC material 2 in a semi-closed space having an atomic number ratio Si/C of more than 1, and heating them to grow the SiC single crystal 1, or acts as the bunching decomposition step S22.

Figure 6:
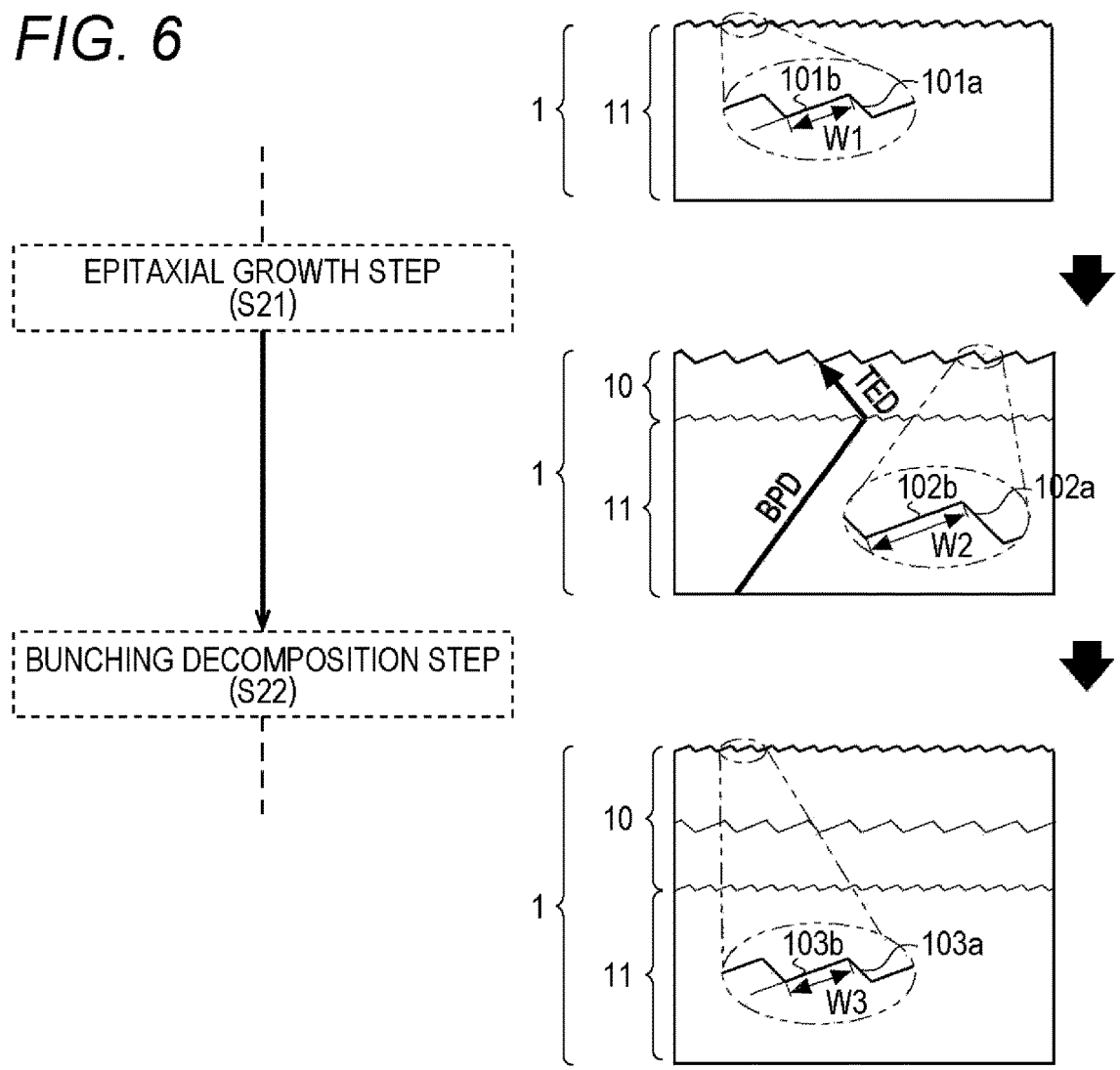
FIG. 6 schematically illustrates the growth step according to an embodiment of the present invention.

As illustrated in FIG. 6, the epitaxial growth step S21 includes growing crystals so as to form the growth layer 10 having the steps 102a and the terraces 102b having the lengthened terrace length W2 on the surface of the SiC single crystal 1 having steps 101a and terraces 101b presenting a reduced terrace length W1, or to form the growth layer 10 having a bunched surface on the base substrate 11.

As illustrated in FIG. 6, in the epitaxial growth step S21, crystal growth is performed to form a growth layer having a basal plane dislocation density (BPD density) of <100/cm², or to convert the BPDs in the SiC single crystal 1 into other defects and dislocations, including threading edge dislocation (TED), to form at least a portion of the growth layer 10.

As illustrated in FIG. 6, the bunching decomposition step S22 includes growing the SiC single crystal 1 on the growth layer 10 surface having the steps 102a and the terraces 102b to form the growth layer 10 having the steps 103a and the terraces 103b presenting the reduced terrace length W3, or to decompose the MSBs on the surface 1a so as to form the growth layer 10 having a planarized, bunching-free surface. At this time, the surface 1a is terminated with the step that presents the height of a full unit in the SiC single crystals.

As used herein, the term "planarized, bunching-free surface" refers to a SiC surface where macro-step bunching (MSB) has been decomposed.

The term "MSBs" in the description herein refers to those steps on the SiC surface that, by bunching, form a height that exceeds the full unit of each polytype.

In other words, MSBs are the steps that are bunched more than 4 molecular layers (5 or more molecular layers) for 4H—SiC and more than 6 molecular layers (7 or more molecular layers) for 6H—SiC.

In the etching step S1, the SiC single crystal 1 and the SiC material 2 are heated so that they become the source and destination of raw material transport, respectively.

In the stress reduction step S0, the SiC single crystal 1 and the SiC material 2 are heated so that the SiC single crystal 1 and the SiC material 2 are the source or the destination of the raw material transport, respectively.

Figure 7:
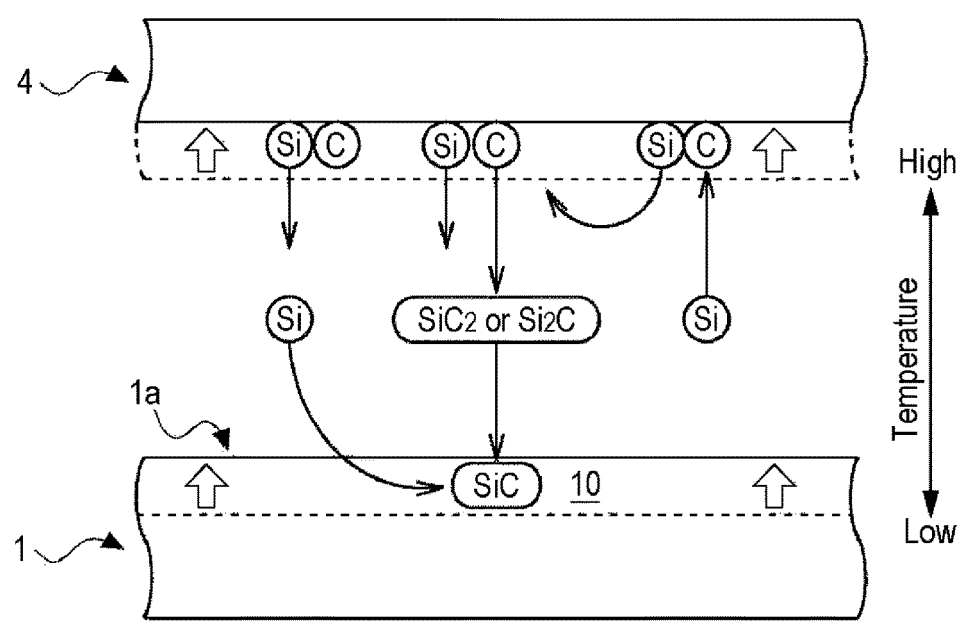
FIG. 7 schematically illustrates the raw material transport mechanism according to an embodiment of the present invention.

As illustrated in FIG. 7, in an embodiment of the present invention, it can be understood that in each of the stress reduction step S0, the etching step S1, and the growth step S2, the following reactions 1) to 5) are continuously performed. For the etching step S1, an example of the reaction step of raw material transport is described below.

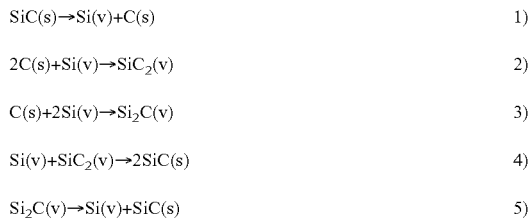

$$SiC(s) \rightarrow Si(v) + C(s) \quad 1)$$

$$2C(s) + Si(v) \rightarrow SiC_2(v) \quad 2)$$

$$C(s) + 2Si(v) \rightarrow Si_2C(v) \quad 3)$$

$$Si(v) + SiC_2(v) \rightarrow 2SiC(s) \quad 4)$$

$$Si_2C(v) \rightarrow Si(v) + SiC(s) \quad 5)$$

1): As the surface 1a of the SiC single crystal 1 is pyrolyzed, Si atoms (Si(v)) are desorbed from the surface 1a.

2) and 3): C atoms (C(s)) remaining on the surface 1a due to desorption of Si atoms (Si(v)) react with Si vapor (Si(v)) in the raw material transport space, and sublimate into the raw material transport space as, for example, $Si_2C$ or $SiC_2$.

4) and 5): The sublimed $Si_2C$, $SiC_2$, or the like reaches and diffuses into the terraces on the surface 2a of the SiC material 2 due to, for example, the temperature gradient and takes over the polymorphism of the surface 2a by reaching the steps, forming the growth layer 10 while presenting the aspect of step-flow growth.

It can be understood that each of the stress reduction step S0, the etching step S1, and the growth step S2 includes a Si atom sublimation step of thermally sublimating Si atoms from the SiC material 2, and a C atom sublimation step of sublimating C atoms remaining on the surface 2a of the SiC material 2 by bonding them with Si atoms in the raw material transport space.

In each of the stress reduction step S0, the etching step S1, and the growth step S2, crystal growth is performed by the supersaturation and condensation of transported $Si_2C$, $SiC_2$, or the like on the surface 1a or 1b of the SiC single crystal 1.

Each of the stress reduction step S0, the etching step S1, and the growth step S2 includes a Si atom sublimation step of thermally sublimating Si atoms from the surface 1a or 1b of the SiC single crystal 1, and a C atom sublimation step of sublimating C atoms remaining on the surface 1a or 1b of the SiC single crystal 1 by bonding them with Si atoms in the raw material transport space.

It can be understood that the stress reduction step S0 reduces the temperature gradient between the SiC single crystal 1 and the SiC material 2, and suppresses the raw material transport between the surface 1a and/or 1b and the surface 2a while sustaining SiC sublimation from the surfaces 1a, 1b, and 2a.

It can be understood that the stress reduction step S0 reduces the vapor pressure difference at the surface of the SiC single crystal 1 and the SiC material 2, or the stress reduction step S0 uniformizes the vapor pressure difference at the surface of the SiC single crystal 1 and the SiC material 2, and suppresses the raw material transport between the surface 1a and/or 1b and the surface 2a while sustaining SiC sublimation from the surfaces 1a, 1b, and 2a.

It can be understood that the stress reduction step S0 reduces the chemical potential difference at the surface of SiC single crystal 1 and the SiC material 2, or uniformizes the chemical potentials at the surfaces of the SiC single crystal 1 and the SiC material 2, and suppresses the raw material transport between the surface 1a and/or 1b and the surface 2a while sustaining SiC sublimation from the surfaces 1a and 2a.

In addition, it can be understood that the stress reduction step S0 suppresses raw material transport between the surface 1a and/or 1b and the surface 2a while sustaining SiC sublimation from the surfaces 1a, 1b and 2a, based on the difference in crystal structure between the surfaces 1a, 1b, and 2a, the temperature difference between the surfaces 1a and 2a, and at least some of the elements constituting the atmosphere.

It can be understood that the stress reduction step S0, for example, suppresses the raw material transport between the surface 1a and/or 1b and the surface 2a while sustaining SiC sublimation from the surface 1a, which is a S1 or C plane, and the surface 2a of the SiC material 2, which is made of SiC polycrystals.

It can be understood that the stress reduction step S0, for example, suppresses the raw material transport between the surface 1a and/or 1b and the surface 2a while allowing SiC sublimation to continue from the surface 1a, which is a S1 or C plane, and the surface 2a, which is a S1 or C plane, respectively, of the SiC material 2, which is made SiC single crystals.

As used herein, the term "suppress raw material transport" and "no raw material transport occurs" refer to reducing the increase or decrease in thickness at the transport source and destination after heating. Therefore, the atoms that constitute each of the source and destination of transport and destination can be the atoms that constitute each of the source and destination of transport after heating.

As used herein, the term "S1 surface" refers to a surface having an off-angle of a few degrees (for example, from 0.4 to 8.0°) from the (0001) plane.

As used herein, the term "C surface" refers to a surface having an off-angle of a few degrees (for example, from 0.4 to 8.0°) from the (000-1) plane.

It can be understood that the driving force for raw material transport between the surfaces 1a and 2a in the etching step S1 and the growth step S2 is the vapor pressure difference between the SiC single crystal 1 and the SiC material 2 due to the temperature gradient formed.

It can also be understood that the driving force for raw material transport between the surfaces 1a and 2a in the etching step S1 and the growth step S2 is not only the temperature gradient between the surfaces of the SiC single crystal 1 and the SiC material 2, but also the chemical potential difference between the SiC single crystal 1 and the SiC material 2.

In the raw material transport in each of the stress reduction step S0, the etching step S1, and the growth step S2, the dopant concentration in the SiC single crystal 1 can be adjusted by supplying a dopant gas into the semi-closed space by a dopant gas supply means. When no dopant gas is supplied, it can be understood that the SiC single crystal 1 takes over the dopant concentration in the semi-closed space.

The raw material transport in each of the stress reduction step S0, the etching step S1, and the growth step S2 is performed under the desired vapor pressure environment including a SiC—Si equilibrium vapor pressure environment and a SiC—C equilibrium vapor pressure environment.

As used herein, the term "SiC—Si vapor pressure environment" refers to the vapor pressure environment when SiC (solid) and S1 (liquid phase) are in phase equilibrium through a vapor phase. The SiC—Si equilibrium vapor pressure environment is formed by heat-treating a semi-closed space having an atomic number ratio Si/C of more than 1.

As used herein, the term "SiC—C equilibrium vapor pressure environment" refers to the environment of vapor pressure when SiC (solid phase) and C (solid phase) are in phase equilibrium through a vapor phase. The SiC—C equilibrium vapor pressure environment is formed by heat-treating a semi-closed space having an atomic number ratio Si/C of 1 or less.

Figure 8:
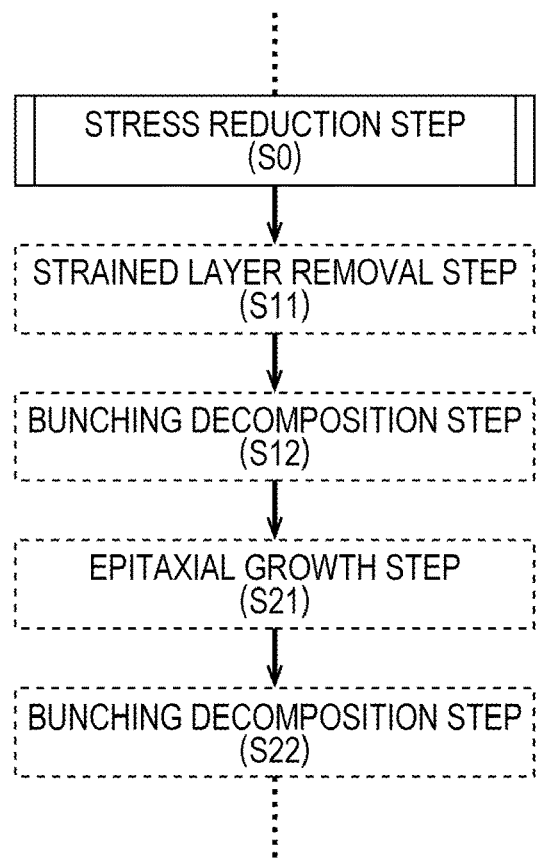
FIG. 8 illustrates an example of a combination of the stress reduction step, the etching step, and the growth step according to an embodiment of the present invention.

As illustrated in FIG. 8, it can be understood that an embodiment of the present invention includes the stress reduction step S0, the strained layer removal step S11, the bunching decomposition step S12, the epitaxial growth step S21, and the bunching decomposition step S22 in this order.

Figure 9:
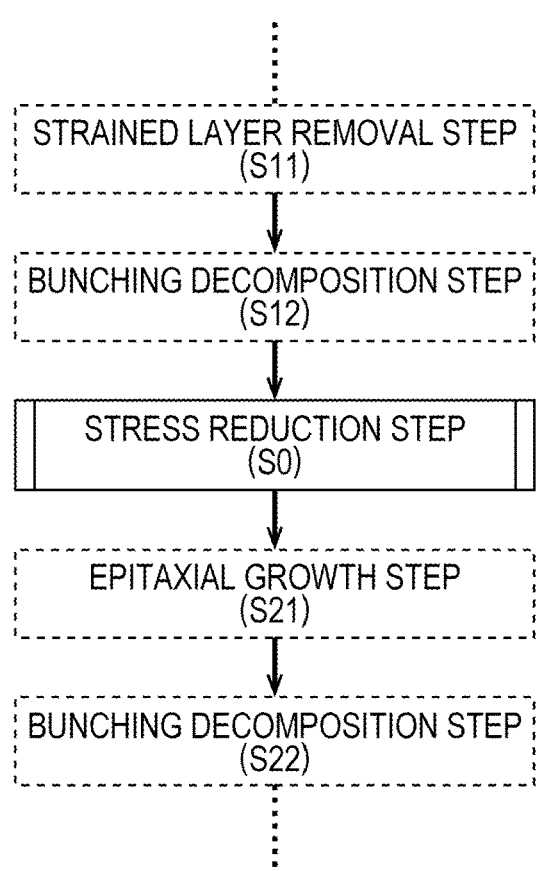
FIG. 9 illustrates an example of a combination of the stress reduction step, the etching step, and the growth step according to an embodiment of the present invention.

As illustrated in FIG. 9, it can be understood that an embodiment of the present invention includes the strained layer removal step S11, the bunching decomposition step S12, the stress reduction step S0, the epitaxial growth step S21, and the bunching decomposition step S22 in this order.

Figure 10:
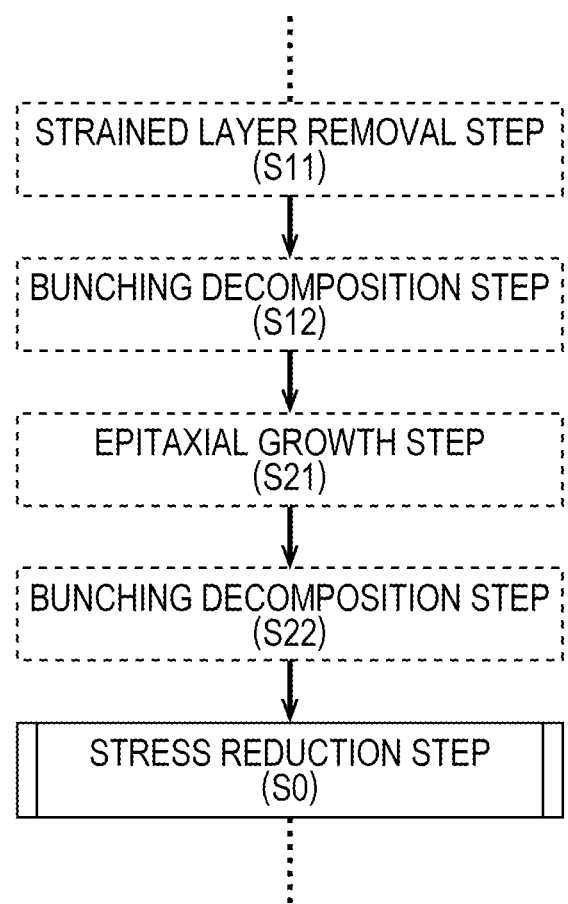
FIG. 10 illustrates an example of a combination of the stress reduction step, the etching step, and the growth step according to an embodiment of the present invention.

As illustrated in FIG. 10, it can be understood that an embodiment of the present invention includes the strained layer removal step S11, the bunching decomposition step S12, the epitaxial growth step S21, the bunching decomposition step S22, and the stress reduction step S0 in this order.

An embodiment of the present invention may include the strained layer removal step S11, the stress reduction step S0, and the bunching decomposition step S12 in this order.

An embodiment of the present invention may include the epitaxial growth step S21, the stress reduction step S0 and the bunching decomposition step S22 in this order.

The order of the steps in an embodiment of the present invention may be determined in any order as appropriate in producing and realizing the SiC single crystal 1 having the desired quality.

Figure 11:
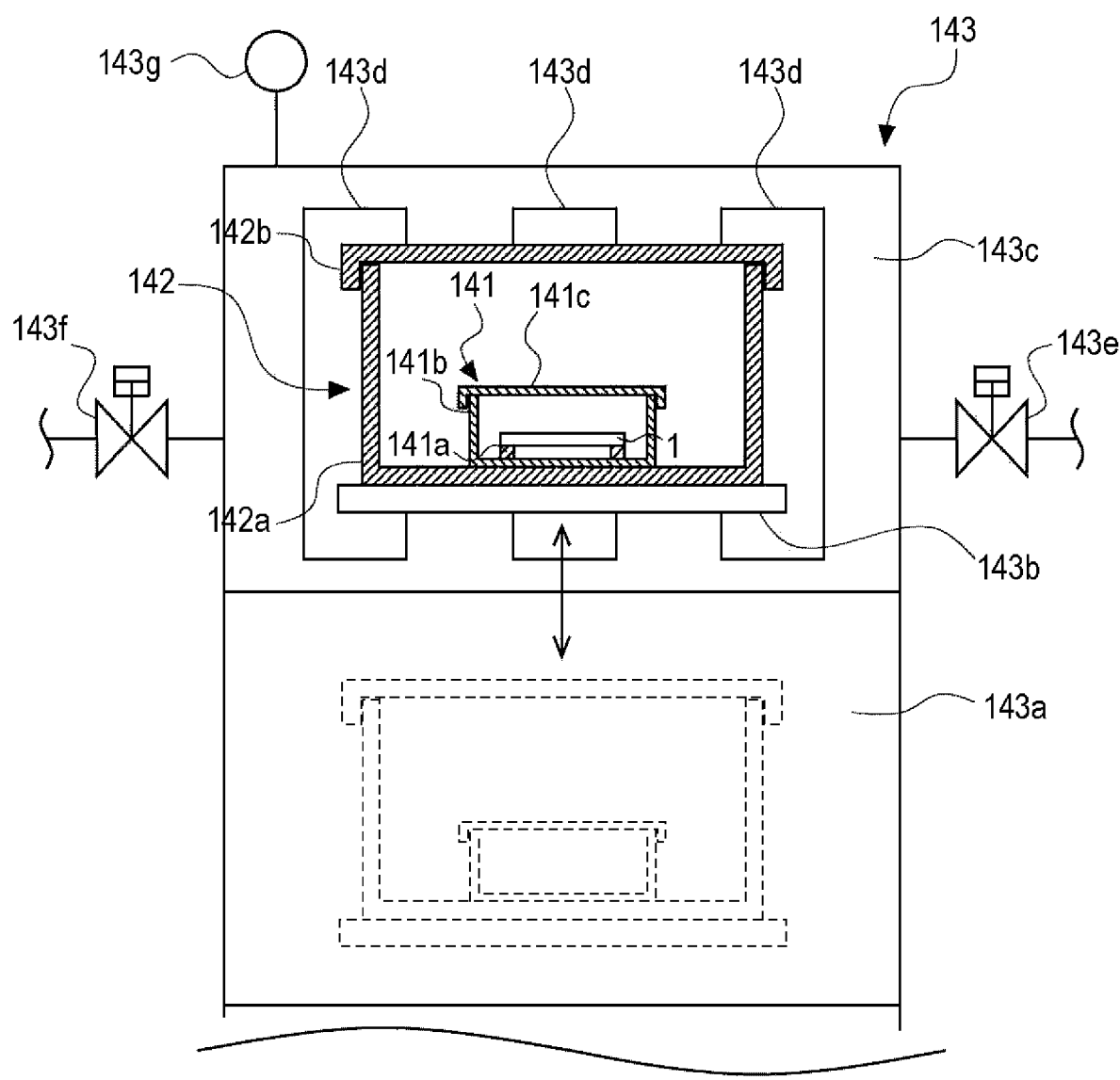
FIG. 11 illustrates an example of a producing apparatus according to an embodiment of the present invention.

As illustrated in FIG. 11, the apparatus for producing SiC single crystals (hereinafter simply referred to as the "producing apparatus") includes a main container 141, a refractory container 142, and a heating furnace 143.

The main container 141 includes a material that includes, for example, SiC polycrystals. Therefore, at least a portion of the main container 141 can be the SiC material 2 or the source of transport (SiC material 2) in raw material transport.

The environment in the heated main container 141 is preferably, for example, a vapor pressure environment of a mixed system of a gas phase species containing Si elements and a gas phase species containing C element. Examples of the gas phase species containing Si elements include Si, $Si_2$, $Si_3$, $Si_2C$, $SiC_2$, and SiC.

Examples of the gas phase species containing C elements include $Si_2C$, $SiC_2$, SiC, and C.

The dopant and dopant concentration of the main container 141 may be selected according to the dopant and dopant concentration of the growth layer 10 to be formed.

Any structure that generates vapor pressure of a gas phase species containing Si elements and a gas phase species containing C elements in the internal space during the heating treatment of the main container 141 may be used. Examples of the structure include a configuration in which the SiC polycrystals are partially exposed on the inner surface, and a configuration in which the SiC polycrystals are separately installed in the main container 141.

The main container 141 may include an installation tool 141a that can be used to install the SiC single crystal 1 and the SiC material 2.

The installation tool 141a is preferably thin. The installation tool 141a that has been thinned places each of the SiC single crystal 1 and the SiC material 2 in close proximity to each other, so as to reduce the separation distance d1 between the SiC single crystal 1 and the SiC material 2.

At this time, each of the plurality of the SiC single crystal bodies 1 and the SiC material bodies 2 may be placed in an alternating configuration.

The main container 141 may be configured without the installation tool 141a. At this time, each of the plurality of the SiC single crystal bodies 1 and the SiC material bodies 2 may be placed in an alternating configuration.

The main container 141 is a fitting container including an upper container 141c and a lower container 141b that can be fitted to each other. A minute gap is formed at the fitting part of the upper container 141c and the lower container 141b, through which the inside of the main container 141 can be evacuated (vacuated).

The main container 141 includes a Si vapor supply source. The Si vapor supply source is used to adjust the atomic number ratio Si/C of the semi-closed space in the main container 141 to be more than 1. Examples of the Si vapor supply source include solid Si (Si pellet such as Si pieces or Si powder) and Si compounds.

For example, when the entire main container 141 includes SiC polycrystals, as in an embodiment of the present invention, it can be understood that the atomic number ratio Si/C in the main container 141 exceeds 1 by installing a Si vapor supply source.

Specifically, it can be understood that the atomic number ratio Si/C in the main container 141 exceeds 1 when the SiC single crystal 1 and the SiC material 2 that satisfy the stoichiometric ratio 1:1 and the Si vapor supply source are installed in the SiC polycrystalline main container 141 that satisfies the stoichiometric ratio 1:1.

The SiC—Si equilibrium vapor pressure environment according to an embodiment of the present invention is formed by heating a semi-closed space having an atomic number ratio Si/C of more than 1.

The SiC—C equilibrium vapor pressure environment according to an embodiment of the present invention is formed by heating a semi-closed space having an atomic number ratio Si/C of 1 or less.

The main container 141 may be configured to house predetermined members as appropriate to provide a SiC—Si equilibrium vapor pressure environment or SiC—C equilibrium vapor pressure environment.

The heating furnace 143 is capable of heating the main container 141 to reduce the temperature gradient so that the temperature of the main container 141 becomes uniform from the upper container 141c to the lower container 141b.

The heating furnace 143 also heats the main container 141 to form a temperature gradient so that the temperature decreases or increases from the upper container 141c to the lower container 141b. With this configuration, the temperature gradient in the thickness direction of the SiC single crystal 1 is controlled.

As illustrated in FIG. 11, the heating furnace 143 includes a main heating chamber 143c capable of heating the SiC single crystal 1 or the like to a temperature of 1000° C. to 2300° C., a preliminary chamber 143a capable of preheating the object to be treated to a temperature of 500° C. or higher, a refractory container 142 capable of housing the main container 141, and a moving means 143b (moving table) capable of moving the refractory container 142 from the preliminary chamber 143a to the main heating chamber 143c.

The main heating chamber 143c is, for example, regular hexagonal in planar cross-sectional view, and the refractory container 142 is installed inside it. The main heating chamber 143c includes heaters 143d (mesh heaters). Multilayer heat-reflective metal plates are fixed to the side walls and ceiling of the main heating chamber 143c (not illustrated). The multilayer heat-reflective metal plates are configured to reflect the heat of the heaters 143d toward the substantially central portion of the main heating chamber 143c.

The heaters 143d are installed in the main heating chamber 143c to surround the refractory container 142 in which the object to be treated
is contained. At this time, the multilayer heat-reflective metal plates are installed on the outside of the heaters 143d, which enables temperature increase in the temperature range of 1000° C. to 2300° C.

The heaters 143d may be, for example, of resistance heating type or high-frequency induction heating type.

The heater 143d may be configured to control the temperature gradient in the refractory container 142. The heater 143d may be configured to reduce the temperature gradient in the refractory container 142. The heater 143d may be configured to form a temperature gradient in the refractory container 142. For example, the heaters 143d may be configured so that more heaters are installed on the upper (or lower) side. The heaters 143d may be configured so that the width increases toward the upper (or lower) side. Alternatively, the heaters 143d may be configured to be able to increase the power supplied toward the upper (or lower) side.

The main heating chamber 143c is connected to a vacuum formation valve 143f for evacuating air from the main heating chamber 143c, an inert gas injection valve 143e for introducing an inert gas into the main heating chamber 143c, and a vacuum gauge 143g for measuring the degree of vacuum in the main heating chamber 143c.

The vacuum formation valve 143f is connected to a vacuum pump (not illustrated) that evacuates air and vacuates the main heating chamber 143c. By using the vacuum formation valve 143f and the vacuum pump, the degree of vacuum in the main heating chamber 143c can be adjusted preferably to 10 Pa or less, more preferably to 1.0 Pa or less, and even more preferably to $10^{-3}$ Pa or less. Examples of the vacuum pump include a turbo molecular pump.

The inert gas injection valve 143e is connected to an inert gas supply source (not illustrated).

This inert gas injection valve 143e and the inert gas supply source allow inert gas to be introduced into the main heating chamber 143c in the range of $10^{-5}$ to $10^4$ Pa. The inert gas may be, for example, Ar.

The inert gas injection valve 143e is a dopant gas supply means capable of supplying a dopant gas into the main container 141. That is, by selecting a dopant gas (for example, $N_2$) as the inert gas, the dopant concentration in the growth layer 10 can be increased.

The preliminary chamber 143a is connected to the main heating chamber 143c, and is configured to allow the refractory container 142 to be moved thereinto by the moving means 143b. The preliminary chamber 143a of the present embodiment is configured to be heated by the residual heat of the heaters 143d of the main heating chamber 143c. For example, when the main heating chamber 143c is heated to 2000° C., the preliminary chamber 143a is heated to about 1000° C., which allows the degassing treatment of the object to be treated (for example, the SiC single crystal 1, the main container 141, or the refractory container 142).

The moving means 143b is configured to move between the main heating chamber 143c and the preliminary chamber 143a with the refractory container 142 on top of it.

The transfer between the main heating chamber 143c and the preliminary chamber 143a by the moving means 143b can be completed in as little as one minute, so that temperature rise and fall at from 1.0 to 1000° C./min can be achieved. This allows for rapid temperature rise and fall, which makes it possible to observe the surface profile without low temperature growth history during temperature rise and fall.

In FIG. 11, the preliminary chamber 143a is located below the main heating chamber 143c, but the preliminary chamber 143a may be installed in any other direction.

The moving means 143b according to the present embodiment is a moving table on which the refractory container 142 is placed. The contact area between the moving table and the refractory container 142 becomes the path for heat propagation. This makes it possible to form a temperature gradient in the refractory container 142 so that the contact area between the moving table and the refractory container 142 is on the low temperature side.

In the heating furnace 143 of the present embodiment, since the bottom of the refractory container 142 is in contact with the moving table, a temperature gradient is provided so that the temperature decreases from the upper container 142b to the lower container 142a of the refractory container 142.

The direction of the temperature gradient can be set in any direction by changing the position of the contact area between the moving table and the refractory container 142. For example, when a suspended type or the like is used for the moving table and the contact area is set on the ceiling of the refractory container 142, heat escapes in the upward direction. Therefore, the temperature gradient can be set so that the temperature increases from the upper container 142b to the lower container 142a of the refractory container 142. This temperature gradient is preferably reduced or formed along the thickness direction of the SiC single crystal 1 and the SiC material 2. As described above, the temperature gradient may be formed or reduced by the configuration of the heater 143d.

The vapor pressure environment of the gas-phase species containing Si elements in the heating furnace 143 according to the present embodiment is formed using the refractory container 142 and a Si vapor supply material. For example, any method that enables the formation of an environment of vapor pressure of a gas phase species containing Si elements around the main container 141 may be used in the apparatus for producing a SiC substrate of the present invention.

The refractory container 142 preferably includes a high-melting point material having a melting point equal to or higher than the melting point of the material constituting the main container 141.

Examples of the refractory container 142 include C which is a general-purpose heat-resistant material, W, Re, Os, Ta, and Mo which are high-melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, and $TiB_2$ which are borides, and SiC polycrystals.

As illustrated in FIG. 11, the refractory container 142, like the main container 141, is a fitting container including the upper container 142b and the lower container 142a that can be fitted to each other, and is configured to house the main container 141. A minute gap 43 is formed at the fitting portion between the upper container 142b and the lower container 142a, through which the inside of the refractory container 142 can be evacuated (vacuated).

The refractory container 142 has a Si vapor supply material that can supply vapor pressure of gas-phase species containing Si elements in the refractory container 142.

The Si vapor supply material should be configured to generate Si vapor in the refractory container 142 during the heat treatment, and examples thereof include solid Si (Si pellets such as S1 pieces and S1 powder) and S1 compounds.

The Si vapor supply material is, for example, a thin film that coats the inner wall of the refractory container 142.

When the refractory container 142 is a metal compound such as TaC, the Si vapor supply material is, for example, a silicide material of the metal and Si atoms constituting the refractory container 142.

The refractory container 142 can maintain the vapor pressure environment of the gas-phase species containing Si elements in the main container 141 by having a Si vapor supply material inside it. It can be understood that this is because the vapor pressure of the gas phase type containing Si elements in the main container 141 and the vapor pressure of the gas phase type containing Si elements outside the main container 141 are balanced.

The present description describes the effects of the present invention with reference to Reference Examples 1 to 3.

Reference Example 1

Under the following conditions, the SiC single crystal substrate E10 is housed in the main container 141, and the main container 141 is housed in the refractory container 142.

Figure 12:
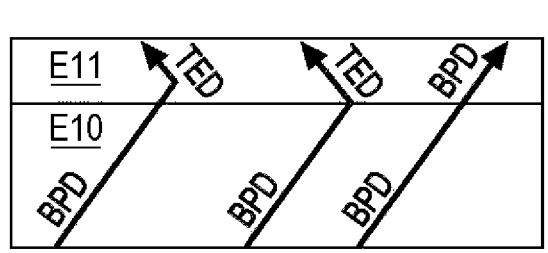
FIG. 12 illustrates the method for determining the BPD conversion rate according to a reference example.
Figure 12:
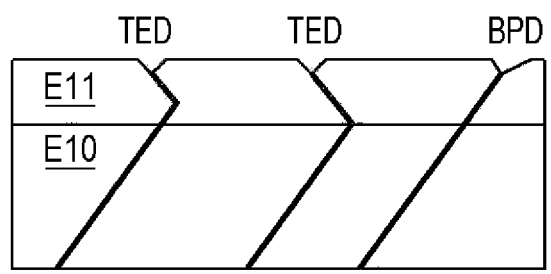
Figure 12:
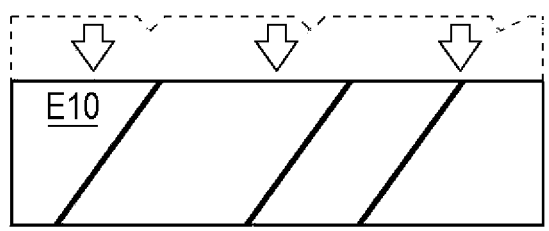
Figure 12:
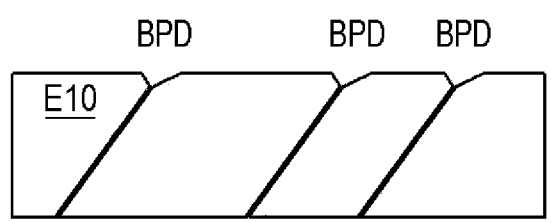

<SiC Single Crystal Substrate E10>
Polymorphism: 4H—SiC
Substrate size: horizontal width (10 mm), vertical width (10 mm), thickness (0.3 mm)
Off-direction and off-angle: 4° off in <11-20> direction
Growth surface: (0001) plane
Presence or absence of MSB: absent
Presence or absence of strained layer: absent
Material: SiC polycrystals
Container size: diameter (60 mm), height (4.0 mm)
Distance between SiC single crystal substrate E10 and SiC material: 2.0 mm
Atomic number ratio Si/C in the container: 1 or less
Material: TaC
Container size: diameter (160 mm), height (60 mm)
Si vapor supply material (Si compound): $TaSi_2$ The SiC single crystal substrate E10 installed under the above conditions is heat-treated under the following conditions.
Heating temperature: 1700° C.
Heating time: 300 min
Temperature gradient: 1.0° C./mm
Growth rate: 5.0 nm/min
Degree of vacuum of main heating chamber 143c: $10^{-5}$ Pa FIG. 12 illustrates the method for determining the conversion rate from BPDs to other defects and dislocations (for example, TED) in the growth layer E11.

FIG. 12(a) illustrates the growth of the growth layer E11 by the heating step. During this heating step, the BPDs present on the SiC single crystal substrate E10 are converted to TEDs with a certain probability. Therefore, TEDs and BPDs are mixed on the surface of the growth layer E11, unless the BPDs are 100% converted.

FIG. 12(b) illustrates the confirmation of defects in the growth layer E11 using the KOH dissolution etching method. In the KOH dissolution etching method, the SiC single crystal substrate E10 is immersed in a dissolved salt (for example, KOH) that has been heated to about 500° C., etch pits are formed in the dislocation or defect region, and the type of dislocation is determined by the size and shape of the etch pits. By this method, the number of BPDs present on the surface of the growth layer E11 is evaluated.

FIG. 12(c) illustrates the removal of the growth layer E11 after KOH dissolution etching. In this method, after planarization by mechanical polishing or CMP to the depth of the etch pit, the growth layer E11 is removed by thermal etching to reveal the surface of the SiC single crystal substrate E10.

FIG. 12(d) illustrates the confirmation of defects in the SiC single crystal substrate E10 after removal of the growth layer E11 from the SiC single crystal substrate E10 using the KOH dissolution etching method. By this method, the number of BPDs present on the surface of SiC single crystal substrate E10 is evaluated.

By comparing the number of BPDs in the surface of the growth layer E11 (see FIG. 12(b)) with the number of BPDs in the surface of the SiC single crystal substrate E10 (see FIG. 12(d)), according to the sequence illustrated in FIG. 12, the BPD conversion rate, which is the conversion of BPDs to other defects and dislocations by heat treatment, can be obtained.

The number of BPDs in the surface of the growth layer E11 in Reference Example 1 was about 0/cm², and the number of BPDs in the surface of the SiC single crystal substrate E10 was 1000/cm². Therefore, it can be understood that BPDs are reduced and removed by heating the SiC single crystal substrate E10 without MSBs on the surface in a semi-closed space having an atomic number ratio Si/C of 1 or less.

In Reference Example 1, since the SiC—C equilibrium vapor pressure environment is formed in the main container 141 so that the atomic number ratio Si/C in the main container 141 is 1 or less, it can be understood that BPDs can be reduced and removed in the growth step S2.

Reference Example 2

Figure 13:
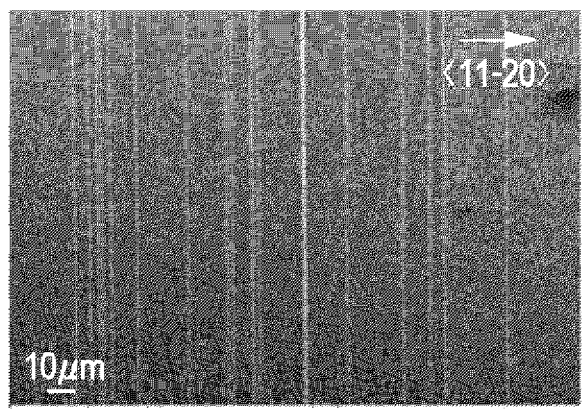
FIG. 13 illustrates a SiC wafer according to a reference example.
Figure 13:
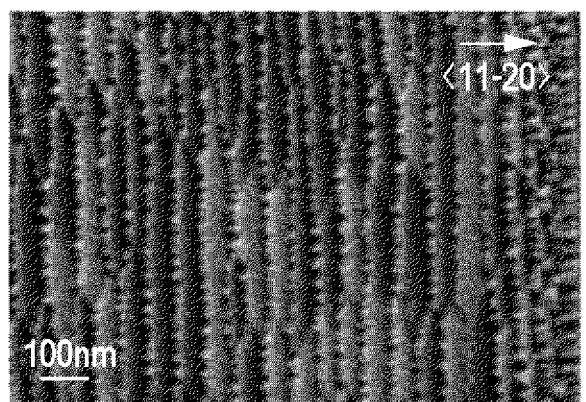

Under the following conditions, the SiC single crystal substrate E10 was housed in the main container 141, and the main container 141 was further housed in the refractory container 142.
<SiC Single Crystal Substrate E10>
Polymorphism: 4H—SiC
Substrate size: horizontal width (10 mm), vertical width (10 mm), thickness (0.3 mm)
Off-direction and off-angle: 4° off in <11-20> direction
Growth surface: (0001) plane
Presence or absence of MSB: present
Material: SiC polycrystals
Container size: diameter (60 mm), height (4.0 mm)
Distance between SiC single crystal substrate E10 and SiC material: 2.0 mm
Si vapor supply source: S1 piece
Atomic number ratio Si/C in the container: more than 1
By housing S1 pieces along with a SiC single crystal substrate in the main container 141, the atomic number ratio Si/C in the container exceeds 1.
Material: TaC
Container size: 160 mm (diameter)×60 mm (height)
Si vapor supply material (Si compound): $TaSi_2$ The SiC single crystal substrate E10 installed under the above conditions is heat-treated under the following conditions.
Heating temperature: 1800° C.
Heating time: 60 min
Temperature gradient: 1.0° C./mm
Growth rate: 68 nm/min
Degree of vacuum of main heating chamber 143c: $10^{-5}$ Pa FIG. 13 is an SEM image of the surface of SiC single crystal substrate E10 before the growth of the growth layer E11. FIG. 13(a) is a SEM image observed at a magnification of ×1000, and FIG. 13(b) is a SEM image observed at a magnification of ×100000. The MSBs are formed on the surface of SiC single crystal substrate E10 before the growth of the growth layer E11, and it can be understood that the steps having a height of 3.0 nm or more are arranged with an average terrace width of 42 nm. The step height was measured by AFM.

Figure 14:
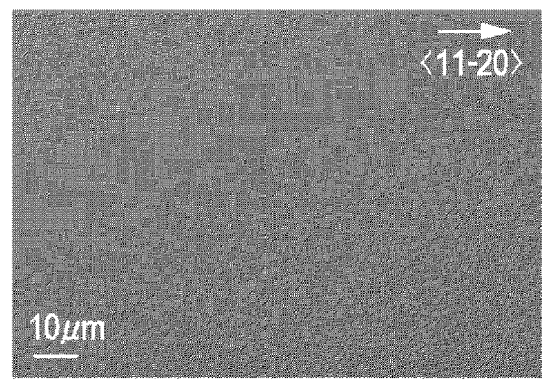
FIG. 14 illustrates a SiC wafer according to a reference example.
Figure 14:
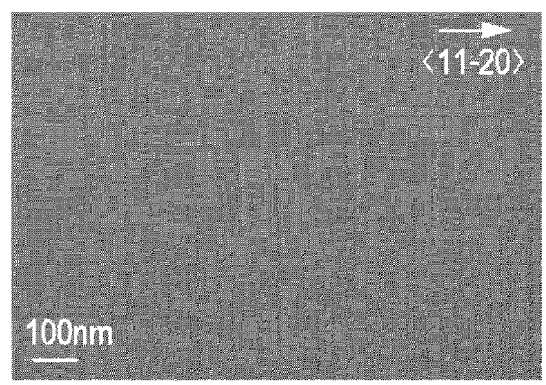

FIG. 14 is an SEM image of the surface of the SiC single crystal substrate E10 after the growth of the growth layer E11. FIG. 14(a) is a SEM image observed at a magnification of ×1000, and FIG. 14(b) is a SEM image observed at a magnification of ×100000.

No MSBs are formed on the surface of the growth layer E11 of Reference Example 2, and it can be understood that the steps having a height of 1.0 nm (full unit cell) are regularly arranged with a terrace width of 14 nm. The step height was measured by AFM.

Therefore, it can be understood that the SiC single crystal substrate E10 having MSBs on the surface is heated in a semi-closed space having an atomic number ratio Si/C of more than 1 to form the growth layer E11 in which the MSBs are decomposed.

In Reference Example 2, the Si vapor supply source is installed so that the atomic number ratio Si/C in the main container 141 exceeds 1, so that a SiC—Si equilibrium vapor pressure environment is formed in the main container 141. Therefore, it can be understood that MSBs on the SiC single crystal substrate surface can be decomposed during the growth step S2.

Reference Example 3

Figure 15:
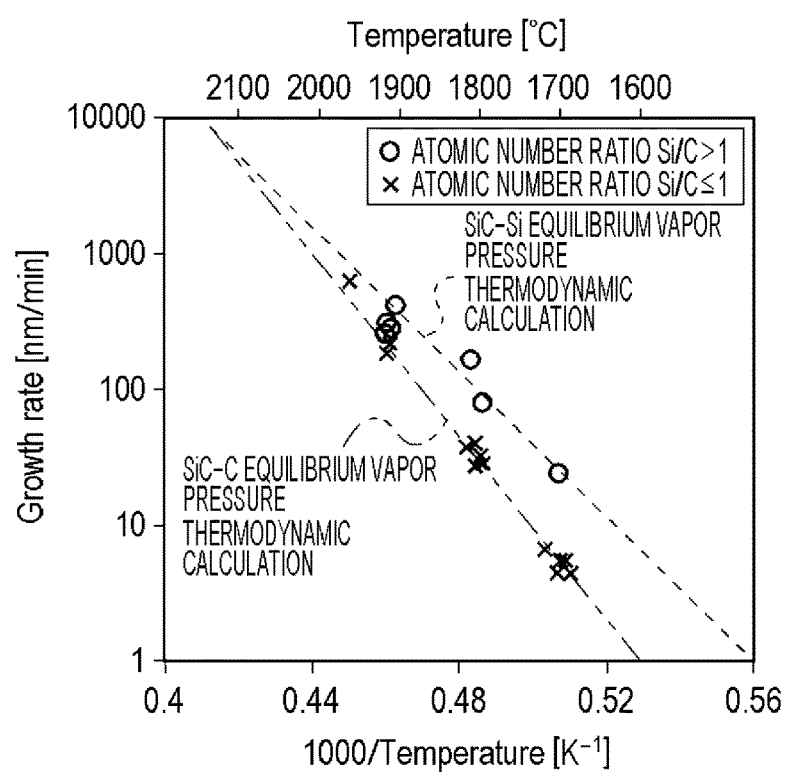
FIG. 15 is an Arrhenius plot according to a reference example.

FIG. 15 is a graph of the relationship between the heating temperature and the growth rate in the method for producing a SiC single crystal substrate of the present invention. The horizontal axis of this graph is the reciprocal of the temperature, and the vertical axis of this graph is the logarithmic growth rate. The results of growing the growth layer E11 on the SiC single crystal substrate E10 by placing the SiC single crystal substrate E10 in a space (in the main container 141) having an atomic number ratio Si/C of more than 1 are marked with o. The results of growing the growth layer E11 on the SiC single crystal substrate E10 by placing it in a space (in the main container 141) having an atomic number ratio Si/C of 1 or less are marked with x.

In the graph in FIG. 15, the results of thermodynamic calculations for SiC substrate growth in a SiC—Si equilibrium vapor pressure environment are depicted as dashed lines (Arrhenius plot), and the results of thermodynamic calculations for SiC substrate growth in a SiC—C equilibrium vapor pressure environment are depicted as double-dotted lines (Arrhenius plot).

In the present method, the SiC single crystal substrate E10 is grown by using the chemical potential difference and temperature gradient as growth driving force under the condition that the vapor pressure environment between the SiC material and the SiC substrate becomes the SiC—C equilibrium vapor pressure environment or SiC—C equilibrium vapor pressure environment. An example of this chemical potential difference is the partial pressure difference of gas phase species generated at the surface of SiC polycrystals and SiC single crystals.

When the partial pressure difference of the vapor generated from the SiC material (source) and the SiC substrate (transport destination) is considered as the growth amount, the SiC growth rate can be obtained by the following equation 1:

[Equation 1]

$$\text{Growth rate} \propto \sum_{i=SiC,Si_2C,SiC_2} \frac{(P_{transport\ source\ i} - P_{transport\ destination\ i})}{\sqrt{2\pi m_i kT}}$$

Where T is the temperature of the SiC material side, mi is the molecular weight of the gas phase species ($Si_xC_y$), and k is the Boltzmann constant. The $P_{transport\ source\ i} - P_{transport\ destination\ i}$ is the growth amount where the raw material gas becomes supersaturated and precipitated as SiC, and SiC, $Si_2C$, and $SiC_2$ are assumed as raw material gases.

Therefore, the dashed line is the result of thermodynamic calculation when SiC single crystals are grown from SiC polycrystals in the vapor pressure environment when SiC (solid) and Si (liquid phase) are in phase equilibrium through a vapor phase. The results were obtained by thermodynamic calculations using the equation 1 under the following conditions (i) to (iv).

The volume of the SiC—Si equilibrium vapor pressure environment is constant.

(ii) The growth driving force is the temperature gradient in the main container 141 and the vapor pressure difference (chemical potential difference) between the SiC polycrystals and SiC single crystals.
(iii) The raw material gases are SiC, $Si_2C$, and $SiC_2$.
(iv) The adsorption coefficient of the raw material on the steps of SiC single crystal substrate E10 is 0.001.

The double-dotted line is the result of thermodynamic calculation when SiC single crystals are grown from SiC polycrystals in the vapor pressure environment when SiC (solid phase) and C (solid phase) are in phase equilibrium through a vapor phase. The results were obtained by thermodynamic calculations using the equation 1 under the following conditions (i) to (iv).

The volume of the SiC—C equilibrium vapor pressure environment is constant.
(ii) The growth driving force is the temperature gradient in the main container 141 and the vapor pressure difference (chemical potential difference) between the SiC polycrystals and SiC single crystals.
(iii) The raw material gases are SiC, $Si_2C$, and $SiC_2$.
(iv) The adsorption coefficient of the raw material on the steps of SiC single crystal substrate E10 is 0.001.

The data for each chemical species used in the thermodynamic calculations were used from JANAF thermochemical tables.

According to the graphs in FIG. 15, it can be understood that the trend of the results of growing the growth layer E11 on the SiC single crystal substrate E10 in the space having an atomic number ratio Si/C of more than 1 (in the main container 141) (marked with o) is consistent with the trend of the results of the thermodynamic calculations of SiC growth in a SiC—Si equilibrium vapor pressure environment. It can be understood that the trend of the results of growing the growth layer E11 on the SiC single crystal substrate E10 in the space (in the main container 141) having an atomic number ratio Si/C of 1 or less (marked with x) is consistent with the trend of the results of thermodynamic calculations of SiC growth in the SiC—C equilibrium vapor pressure environment.

In a SiC—Si equilibrium vapor pressure environment, it can be understood that a growth rate of 1.0 μm/min or more is achieved at a heating temperature of 1960° C. It can also be understood that a growth rate of more than 2.0 μm/min is achieved at a heating temperature of 2000° C. or higher. On the other hand, in the SiC—C equilibrium vapor pressure environment, it can be understood that a growth rate of 1.0 μm/min or more is achieved at a heating temperature of 2000° C. It can also be understood that a growth rate of 2.0 μm/min or more is achieved at a heating temperature of 2030° C. or higher.

The warpage amount 0d of the SiC single crystal wafer produced according to an embodiment of the present invention is preferably <30 μm, more preferably <20 μm, even more preferably <10 μm, and ye even more preferably <1.0 μm.

The diameter of the SiC single crystal wafer produced according to an embodiment of the present invention is preferably 6 inches or more, more preferably 8 inches or more, and even more preferably 12 inches or more.

The BPD density of the growth layer 10 on the SiC single crystal wafer produced according to an embodiment of the present invention is preferably <1000/$cm^2$, more preferably <500/$cm^2$, and even more preferably <100/$cm^2$.

The growth layer 10 on the SiC single crystal wafer produced according to an embodiment of the present invention refers to a growth layer having a doping concentration of >1.0×$10^{17}$/$cm^3$.

In one embodiment of the present invention, it can be understood that the BPD density of the base substrate 11 directly below the growth layer 10 on the surface of the SiC single crystal wafer is, for example, 5000/$cm^2$ or more.

REFERENCE SIGNS LIST

0d Warpage amount
1 SiC single crystal
1a Surface
1b Surface
2 SiC material
2a Surface
10 Growth layer
11 Base substrate
43 Gap
101a Step
101b Terrace
102a Step
102b Terrace
103a Step
103b Terrace
141 Main container
141a Installation tool
141b Lower container
141c Upper container
142 Refractory container
142a Lower container
142b Upper container
143 Heating furnace
143a Preliminary chamber
143b Moving means
143c Main heating chamber
143d Heater
143e Inert gas injection valve
143f Vacuum formation valve
143g Vacuum gauge
300 Strained layer
301 Crystal dislocation
302 Damaged region
E10 SiC single crystal substrate
E11 Growth layer
W1 Terrace length
W2 Terrace length
W3 Terrace length
d1 Separation distance
S0 Stress reduction step
SX Heat treatment step
S1 Etching step
S11 Strained layer removal step
S12 Bunching decomposition step
S2 Growth step
S21 Epitaxial growth step
S22 Bunching decomposition step

The invention claimed is:
1. A method for producing SiC single crystals, comprising a stress reduction step of heating a SiC single crystal and a SiC material at 1800° C. or higher in an atmosphere containing S1 and C elements to reduce internal stress in the SiC single crystal.

2. The producing method according to claim 1, wherein in the stress reduction step, the SiC single crystal is heated without changing the thickness and diameter of the SiC single crystal.

3. The producing method according to claim 1, wherein in the stress reduction step, the SiC single crystal is heated in a semi-closed space.

4. The producing method according to claim 1, wherein in the stress reduction step, the SiC single crystal is heated in an atmosphere containing an inert gas.

5. The producing method according to claim 1, wherein in the stress reduction step, the SiC single crystal is heated to uniformize the temperature of the SiC single crystal.

6. The producing method according to claim 1, further comprising a heat treatment step, in addition to the stress reduction step, of heating the SiC single crystal and the SiC material at 1400° C. or higher in an atmosphere containing S1 and C elements, wherein the heat treatment step comprises an etching step and/or a growth step.

7. The producing method according to claim 6, wherein in the heat treatment step, the SiC single crystal and the SiC material are heated so that the SiC single crystal is on the high temperature side and the SiC material is on the low temperature side, and the SiC single crystal is etched.

8. The producing method according to claim 6, wherein in the heat treatment step, the SiC single crystal and the SiC material are heated so that the SiC single crystal is on the low temperature side and the SiC material is on the high temperature side, and the SiC single crystal is crystal-grown.

9. The producing method according to claim 6, wherein the heat treatment step comprises a step of heating the SiC single crystal and the SiC material in a semi-closed space having an atomic number ratio Si/C of 1 or less.

10. The producing method according to claim 6, wherein the heat treatment step comprises a step of heating the SiC single crystal and the SiC material in a semi-closed space having an atomic number ratio Si/C of more than 1.

11. The producing method according to claim 6, wherein the heat treatment step comprises a strained layer removal step of etching the strained layer on the SiC single crystal.

12. The producing method according to claim 6, wherein the heat treatment step comprises a bunching decomposition step of decomposing macro-step bunching on the SiC single crystal to planarize the surface of the SiC single crystal.

13. The producing method according to claim 6, wherein the heat treatment step comprises an epitaxial growth step of forming a growth layer having a BPD density of <100/cm$^2$.

14. The producing method according to claim 6, wherein the method for producing the SiC single crystal comprises the stress reduction step and the heat treatment step in this order.

* * * * *